United States Patent [19]

Koyama et al.

[11] Patent Number: 4,789,760
[45] Date of Patent: Dec. 6, 1988

[54] VIA IN A PLANARIZED DIELECTRIC AND PROCESS FOR PRODUCING SAME

[75] Inventors: Linda J. Koyama, Sunnyvale; Mammen Thomas; Harry J. Levinson, both of San Jose, all of Calif.

[73] Assignee: Advanced Micro Devices, Inc., Sunnyvale, Calif.

[21] Appl. No.: 728,962

[22] Filed: Apr. 30, 1985

[51] Int. Cl.⁴ .............................................. H05K 1/00
[52] U.S. Cl. .................................. 174/68.5; 361/414; 427/97
[58] Field of Search ............... 174/68.5; 361/412, 414; 427/97

[56] References Cited

U.S. PATENT DOCUMENTS

| | | | |
|---|---|---|---|
| 3,597,834 | 8/1971 | Lathrop | 174/68.5 X |
| 3,725,743 | 4/1973 | Murayama | 174/68.5 |
| 3,846,166 | 11/1974 | Saiki et al. | 174/68.5 X |
| 4,172,004 | 10/1979 | Alcorn et al. | 427/97 |
| 4,371,744 | 2/1983 | Badet et al. | 174/68.5 |
| 4,566,186 | 1/1986 | Bauer et al. | 427/97 X |
| 4,617,730 | 10/1986 | Geldermans et al. | 174/68.5 X |
| 4,635,358 | 1/1987 | Fritz | 174/68.5 X |
| 4,638,400 | 1/1987 | Brown et al. | 174/68.5 X |

FOREIGN PATENT DOCUMENTS 1665015  12/1970  Fed. Rep. of Germany ..... 174/68.5

Primary Examiner—Morris H. Nimmo
Attorney, Agent, or Firm—John P. Taylor

[57] ABSTRACT

An improved integrated circuit structure is disclosed wherein a first metal layer is coated with a dielectric material and another metal layer is applied over the dielectric layer and a via electrically interconnects at least a portion of the first metal layer with at least a portion of the second metal layer. The via is formed having a lower first width dimension adjacent the first metal layer and an upper enlarged width portion adjacent the second metal layer formed by masking the dielectric with a mask having an opening conforming to the first dimension and isotropically etching the dielectric through the mask to provide the enlarged portion adjacent the upper surface of the dielectric.

7 Claims, 4 Drawing Sheets

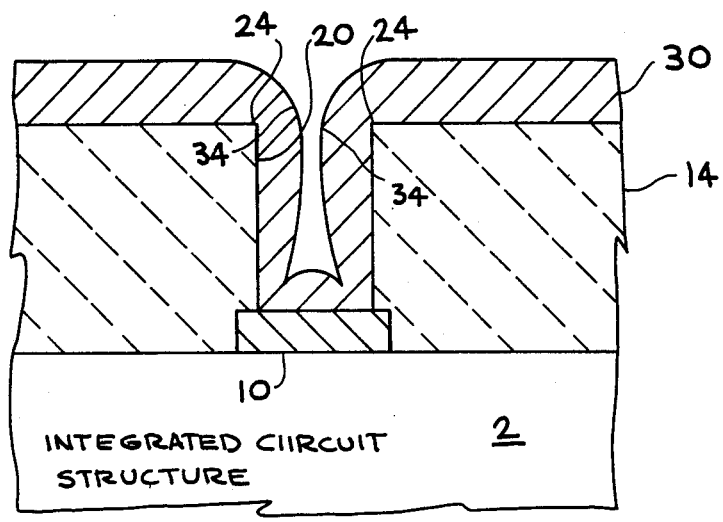
FIG. 1A (PRIOR ART PROBLEM)
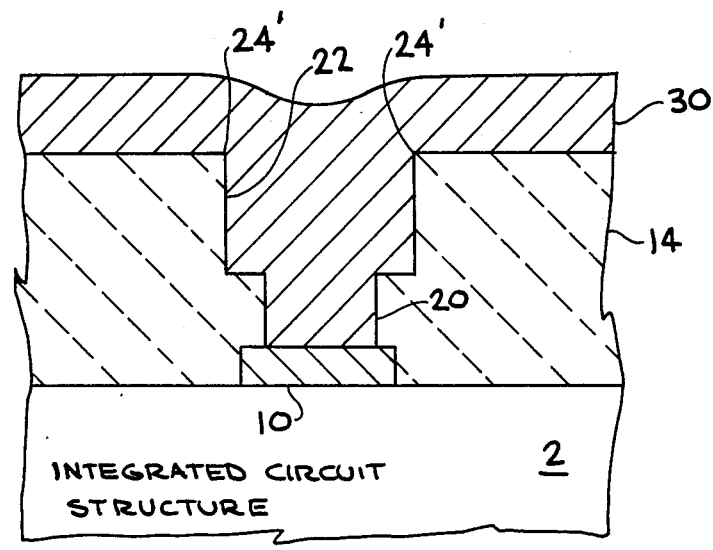
FIG. 1B (PRIOR ART SOLUTION)

VIA IN A PLANARIZED DIELECTRIC AND PROCESS FOR PRODUCING SAME

BACKGROUND OF THE INVENTION

1. Field of the Invention

This invention relates to vias formed in integrated circuit devices. More particularly, this invention relates to an improved via formed in a planarized dielectric used to electrically separate adjacent metal layers in integratd circuit devices.

2. Description of the prior Art

Multilayer integrated circuit devices having a plurality of metal layers separated by dielectric layers utilize etched openings or vias through the dielectric layer to electrically interconnect selected portions of one metal layer with selected portions of an adjacent metal layer. The portion of the lower metal layer to which contact is to be made may comprise a narrow strip or line of metal of, for example, 2 to 4 micron width. It is, therefore, important that the width of the opening etched through the overlying dielectric layer does not exceed this dimension, or even overlap the width of the underlying metal to avoid contacting other portions of the underlying integrated circuit structure with the etching means used to form the via.

The use of narrow openings, however, presents difficulty in the subsequent metallization or filling of the via with metal, as shown in FIG. 1A. In this figure, a lower metal line 10 is formed by masking and etching a metal layer placed over an underlying integrated circuit structure 2. Dielectric material 14 is placed over metal line 10, and an opening or bore 20 is then etched through dielectric 14 which is subsequently filled with metal. This forms a via which provides interconnection of metal line 10 with a second metal layer 30 which is deposited over dielectric layer 14. However, the upper corners 24 of the bore 20 provide a constriction which results in the necking in at 34 of the metal used to fill bore 20 to interconnect metal line 10 with upper metal layer 30.

As shown in FIG. 1B, a successful prior art approach to solving this problem was to etch a first narrow opening 20 and then to subsequently remask dielectric laYer 14 with a mask providing a larger opening followed by a subsequent anisotropic etch to provide opening 22. The corners 24' of dielectric 14. thus, were further apart, the depth of opening 22 was made shallower, and the constrictions or necking in problem was thereby reduced. This method was either practiced using a single dielectric layer or in combination with a multilayer dielectric deposition and planarization such as described and claimed in U.S. Pat. No. 4,481,070 invented by two of us and assigned to the assignee of this invention, and cross-reference to which is hereby made.

This prior art solution to the problem, however, resulted in the need for two separate masking steps to etch the two opening widths shown in FIG. 1B. Since each masking step is, in reality, a number of steps to apply, expose, and develop the photo-resist, etch the dielectric, and then remove the photoresist coating, followed by a repeat of the foregoing steps, the solution to the problem was very inefficient. The additional steps not only involved extra costly time, effort, and material, but had an additional negative impact on the yield.

It, therefore, would be desirable to reduce the problem of the necking in or shadowing of the metallization of the via without the need for two separate masking steps.

SUMMARY OF THE INvENTION

It is therefore an object of this invention to provide an improved via and a process for making same utilizing a single masking step.

It is another object of the invention to provide an improved via using a single masking step wherein a first isotropic etch is used to remove an upper part of the dielectric material, and an anisotropic etch is used to complete the opening to the underlying metal.

It is yet another object of the invention to provide an improved via structure for an integrated circuit device wherein the dielectric material placed over the lower metal layer is planarized prior to formation of the via to provide improved step coverage while providing adequate coverage of dielectric over the first metal layer.

It is a further object of the invention to provide an improved via structure for an integrated circuit device wherein the dielectric material is first deposited over the underlying metal, planarized, and a second dielectric material is then placed over the first dielectric material and planarized followed by formation of the via to thereby enhance the planarization of the dielectric separating the underlying metal layer from the upper metal to provide a more uniform and smoother coverage of the first metal while providing an adequate amount of dielectric to separate the first metal from the overlying second metal which interconnects with the first metal through the via.

These and other objects of the invention will be apparent from the following description and accompanying drawings.

In accordance with the invention, an improvement in the interconnection of adjacent metal layers in an integrated circuit device is provided wherein a first metal layer is coated with a dielectric material and another metal layer is applied over the dielectric layer, the improvement comprising a via electrically interconnecting at least a portion of the first metal layer with at least a portion of the second metal layer and having a first width dimension adjacent the first metal layer and an enlarged width portion adjacent the second metal layer formed by masking the dielectric with a mask having an opening conforming to the first width dimension; isotropically etching the dielectric through the mask to provide the enlarged portion adjacent the upper surface of the dielectric; and then anisorropically etching, through the mask, the remainder of the dielectric thickness to the underlying metal.

BRIEF DESCRIPTION OF THE DRAWINGS

FIG. 1A is a fragmentary vertical cross-sectional view of a prior art via illustrating the problems associated with the prior art use of a narrow width via.

FIG. 1B is a fragmentary vertical cross-sectional view of a prior art solution to the problem of a narrow width via.

FIG. 10 is a fragmentary vertical cross section of the final structure of the invention.

DESCRIPTION OF THE PREFERRED EMBODIMENTS

As previously discussed, it is necessary, for electrical purposes, to separate a first metal layer on an integrated circuit structure from a subsequent metal layer using a dielectric material of sufficient thickness to provide the necessary insulation as well as provide a sufficiently low capacitance for the related circuitry. The opening etched through the dielectric layer must be sufficiently wide to provide for the deposition of metal therein to provide the via or connecting contact between the two layers. However, the width of the via may not exceed the width of a metal line, comprising a portion of the lower metal layer to be contacted, to avoid damage to adjoining portions of the integrated circuit structure. Furthermore, the application of dielectric material over the metal lines comprising the first metal layer results in the formation of steps which should be removed by planarization to provide for more adequate coverage over the dielectric by a second metallization layer.

Conveniently, the dielectric material comprises silicon oxide although other dielectric materials, such as silicon nitride, aluminum oxide, or a silicon oxide doped with phosphorus could be used depending upon their availability and convenience in applying to the surface.

Figure 2:
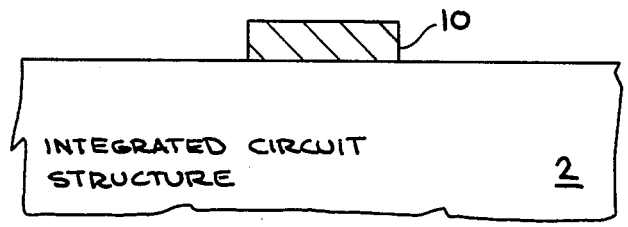
FIG. 2 is a fragmentary vertical cross section of a sequential step of the process of the invention showing initial formation of a metal line over an integrated circuit substrate.
Figure 3:
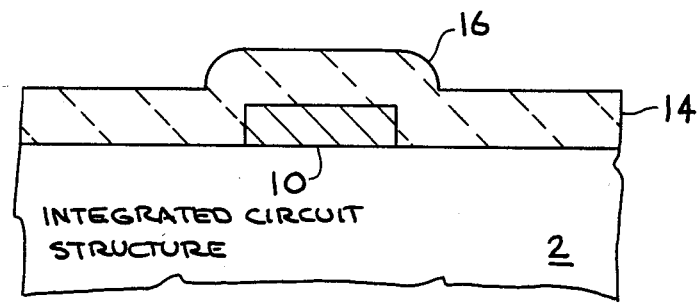
FIG. 3 is a fragmentary vertical cross section of a sequential step of the process of the invention showing formation of a dielectric layer over the metal line shown in FIG. 2.
Figure 4:
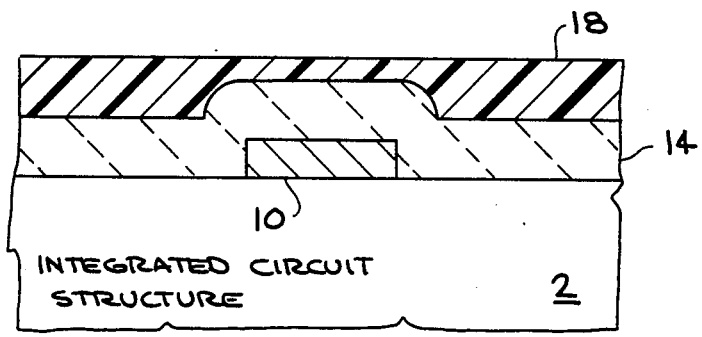
FIG. 4 is a fragmentary vertical cross section of a sequential step of the process of the invention showing application of an etchable material such as a photoresist over the structure shown in FIG. 3.

Referring now to FIG. 2, an integrated circuit structure is shown at 2 having a metal line 10 thereon defined by previously masking and etching a first metal layer. A first dielectric layer 14 is applied over metal line 10 resulting in the formation of the step shown at 16 shown in FIG. 3. Dielectric layer 14 is planarized by first applying thereto a layer of an etchable material 18 which may be spun onto the structure to form a more or less planar surface thereon as shown in FIG. 4.

Figure 5:
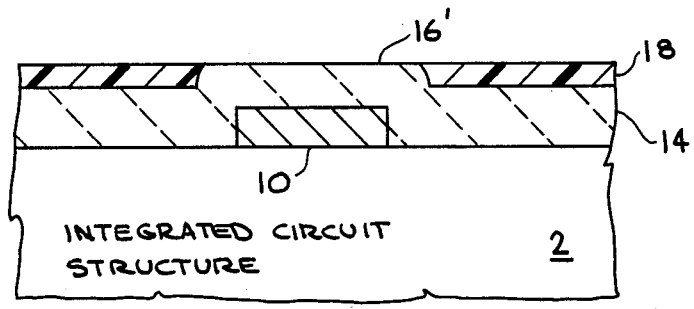
FIG. 5 is a fragmentary vertical cross section of a sequential step of the process of the invention showing parital dry etching of the etchable material applied in FIG. 4 to expose the raised portion of the dielectric layer over the metal line.
Figure 6:
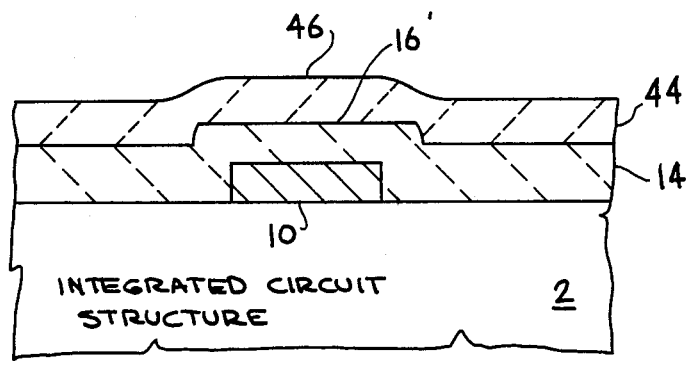
FIG. 6 is a fragmentary vertical cross section of a sequential step of the process of the invention showing removal of the layer of etchable material and application of a second dielectric layer over the remainder of the first dielectric layer.
Figure 7:
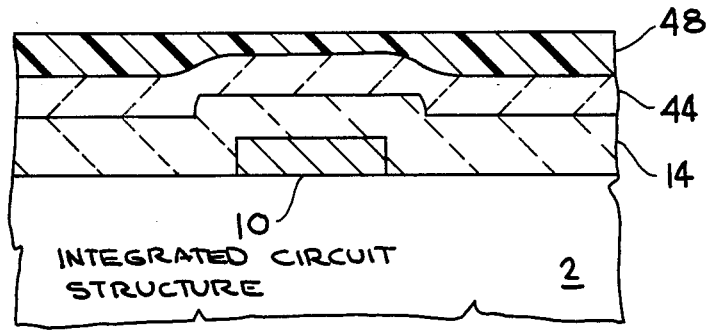
FIG. 7 is a fragmentary vertical cross section of a sequential step of the process of the invention showing application of a second layer of etchable material such as a photo-resist layer over the structure of FIG. 6.

A particularly convenient etchable material which is already in use for other purposes in integrated circuit manufacture is an organic coating of photoresist material. Photoresist material, such as, for example, Shipley 1470 or Kodak 747 has been found to be etchable at about the same rate as silicon dioxide with appropriate etch conditions such as are well known to those skilled in the art when both are present together as shown in FIGS. 4 and 5. After the smoothing process, such as dry etching, the remnants of the photoresist materials still remaining may then be removed by an organic solvent which will not attack the underlying oxide layer.

The thickness of the photoresist or other etchable layer should be sufficient to fill in the low spots or portions of the dielectric layer without unduly building up the thickness of the higher portions of the insulation layer. This will vary based on the type of smoothing or removal means used to subsequently remove portions of the dielectric material and any other etchable material, such as photoresist, which has been placed over the dielectric layer. Presuming that the two materials have been preselected to provide approximately the same removal rate, a process, such as an anisotropic dry etching as with a plasma etch using an appropriate chemistry, e.g., $O_2$, $CHF_3$, $C_2F_6$, and Helium, will remove equal amounts of both materials.

Since the photoresist material remaining will be subsequently dissolved away, it is also important that the photoresist material not be unduly thick over the raised portions of dielectric layer to permit the etching means to remove the high portions since a removal of these high portions of the dielectric material is the ultimate goal of the smoothing out step.

The structure is then isotropically dry etched, using a plasma etch or a reactive ion etch, as shown in FIG. 5 to remove a uniform thickness of material. As shown in FIG. 5, at least a portion of the step 16 (shown in FIG. 3) has been removed by the planarization step leaving a small remainder 16' thereon. A second dielectric layer 44 is now applied over the remainder of dielectric layer 14. This results in a new step 46 over step 16'. Dielectric material 44 may comprise the same material as dielectric 14. Preferably, the two materials are chosen to be the same to provide a more homogeneous dielectric layer.

Figure 8:
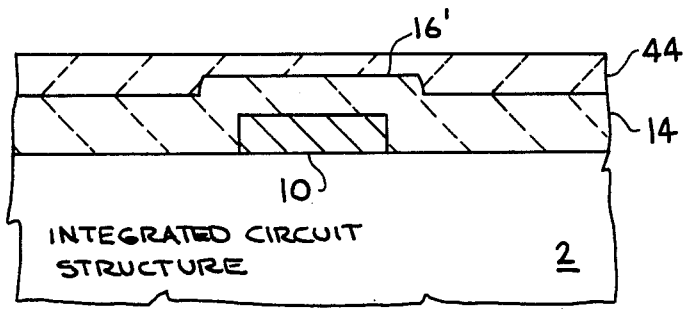
FIG. 8 is a fragmentary vertical cross section of a sequential step of the process of the invention showing partial dry etching of the second layer of etchable material applied in FIG. 7 to planarize the second dielectric layer over the metal line.

A second etchable material such as photoresist layer 48 is now applied over dielectric layer 44 to again form a more or less planar surface. The structure is again subject to a dry etch to remove the photoresist material 48 as well as the step portion 46 of layer 44 resulting in a more or less planarized dielectric layer as shown in FIG. 8 comprising layers 44 and 14 which, for convenience sake, will be designated merely as layer 14 in the remaining figures.

Figure 9:
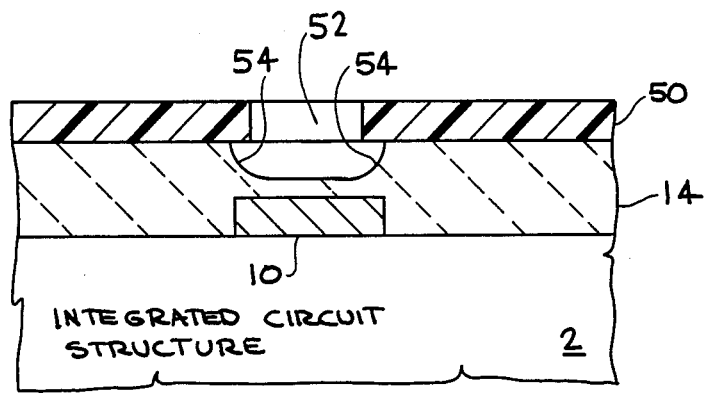
FIG. 9 is a fragmentary vertical cross section of a sequential step of the process of the invention showing application of a patterned photoresist mask over the dielectric layers and isotropic etching of the upper portion of the dielectric layers through the mask to form an enlarged opening in the surface of the dielectric layers.

Referring now to FIG. 9, a photoresist mask 50 is applied over dielectric layer 14 to provide a narrow opening 52 which is more or less centered over metal line 10. Dielectric layer 14 is then isotropically etched, partially, but not completely, over the surface of the metal line 10 to provide the enlarged opening which undercuts 50 at 54.

The depth to which the isotropic etch should be carried out will vary with the thickness of the dielectric layer 14. Preferably, the depth of the isotropic etch should be to within about 0.5 micron of the upper surface of the underlying metal material. This remaining thickness of 0.5 micron should be sufficient to ensure that the wide isotropic etch does not penetrate sufficiently into dielectric layer 14 to contact either the submetal or the remainder of the integrated circuit structure on either side of the width of metal line 10. Furthermore, the remaining thickness of 0.5 micron is sufficiently thin to permit the subsequent anisotropic etching of a smaller or narrower width opening therethrough from the isotropically formed opening to the metal surface without resulting in the formation of the shadows or "necking in" of metal which was experienced in the prior art when only a narrow, uniform width, via was utilized.

While it is recognized that the isotropic etch will result in a larger amount of undercutting as the thickness of the dielectric increases, this is actually somewhat beneficial since the thicker the dielectric material the deeper the via will be, and the more relief or cutaway adjacent the upper surface of the via will be necessary to avoid the prior art problem of necking and shadowing, etc. Typically, the dielectric may be from about 1 to 2.0 microns in thickness with the isotropic etch then varying from about 0.5 to 1.5 micron with a remainder of 0.5 micron maintained between the depth of the isotropic etch and the upper surface of the underlying metal layer.

The isotropic etch may be carried out using either a plasma or a wet etch. Since the plasma etch may be a little more difficult to control, a wet etch is actually preferred although both wet or plasma etch should be deemed to be within the scope of the invention. Typically, an ammonium fluoride/acetic acid etch preferably may be used, but a dilute HF etchant may also be used. The latter etchant must be used with particular care to avoid penetrating through the dielectric material to the underlying metal since the HF etchant will also etch away the metal.

The width of opening 52 should be about 0.7 to 2 microns (depending on the resolution of the lithography) with the undercutting of mask 50 by the isotropic etch being at least about 0.5 micron or more in addition to the initial width of the mask opening. After the dielectric has been isotropically etched, the formation of the via is completed by performing an anisotropic etch down to the surface of metal line 10 to provide the opening 56 as shown in FIG. 10 which, typically, will be about 1.5 microns in width.

Figure 10:
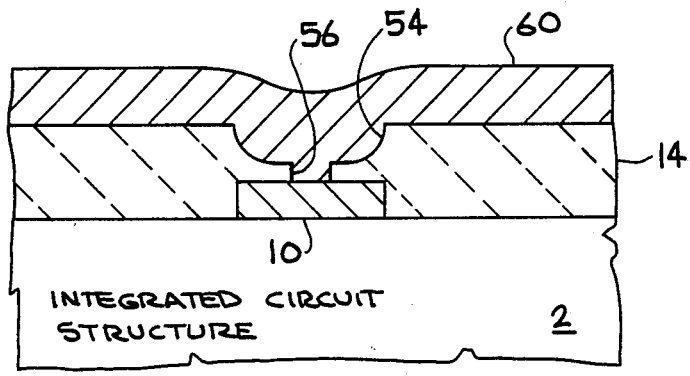
FIG. 10 is a fragmentary vertical cross section of the final structure of the invention after removal of the patterned photoresist mask, anisotropic etching of a reduced diameter opening through the remainder of the dielectric layers at the bottom of the isotropically formed opening in the dielectric layers to the metal line, and filling of the resulting via with a metal layer.

As further shown in FIG. 10, after completion of the etching step, the mask 50 is removed, and a second metallized layer 60 is applied. Metallized layer 60 is applied to cover dielectric 14 as well as to fill the etched opening to form the via to make contact with metal line 10.

The resultant via has a narrow lower width which provides contact to the underlying metal line without risking lateral contact to other portions of the underlying integrated circuit structure laterally adjacent metal line 10. At the same time, the upper portion of the metal via is enlarged to provide adequate metal coverage without the formation of necking in or shadowing and at the same time minimizing the step formed by application of the metal into the via area.

Thus, the invention provides an integrated circuit structure having an improved via and planarized surface. The invention provides an improved via with an enlarged upper width and a narrow lower width formed using a single mask with a first isotropic etch and a subsequent anisotropic etch. The dielectric material used to separate the first metal layer from the second metal layer is planarized, preferably by a double planarization technique, prior to formation of the via and subsequent metallization to thereby provide better step coverage and a more adequate interconnection between the first metal layer and the second metal layer.

Having thus described the invention, what is claimed is:

1. An improved integrated circuit structure having an interconnection of adjacent metal layers wherein a first metal layer is coated with a dielectric material and another metal layer is applied over the dielectric layer, said interconnection comprising a filled via electrically interconnecting at least a portion of said first metal layer with at least a portion of said second metal layer and having a first segment of constant width dimension adjacent said first metal layer and an enlarged generally hemispherical shaped second segment adjacent said second metal layer formed by masking said dielectric with a mask having an opening conforming to said first segment and isotropically etching a portion of the dielectric through the mask to provide said generally hemispherical shaped enlarged second segment adjacent the upper surface of the dielectric.

2. The structure of claim 1 wherein the dielectric separating the adjacent metal layers is planarized to provide a more uniform upper metla layer.

3. The structure of claim 2 wherein the planarized dielectric structure is provided by applying a first dielectric layer, planarizing the layer, and then applying a further dielectric layer followed by planarization of the further dielectric layer.

4. An improved integrated circuit structure comprising two metal layers separated by a dielectric layer and electrically connected together by an improved via interconnect comprising an opening extending through said dielectric layer and filled with a conductive material for interconnecting said two metal layers separated by said dielectric layer, said via interconnect comprising an enlarged generally hemishperical shaped first portion formed by isotropically etching said generally hemispherical shaped first portion through a part of said dielectric layer from a first surface of said dielectric layer and a smaller diameter second portion having sidewalls approximately normal to said first surface formed by anistropically etching through the remainder of the dielectric layer to the opposite surface of the dielectric layer.

5. An improved integrated circuit structure having a conductive interconnection between two metal layers comprising:
(a) a first metal layer;
(b) a dielectric layer formed over said first metal layer and having a first surface in contact with said first metal layer;
(c) a second metal layer formed over a second surface of said dielectric layer and extending into an opening in said dielectric layer to electrically communicate with said first metal layer, said opening in said dielectric layer comprising:
(1) a first generally hemispherical portion formed by partially isotropically etching said dielectric layer to within about 0.5 microns of said first surface through a mask opening in a mask formed on said second surface of said dielectric layer, said mask opening therein having a fixed dimension whereby said first portion of said opening will have a diameter adjacent said mask which is wider than the diameter of said mask opening and said diameter of said first portion of said opening will gradually diminish due to the isotropic nature of said etch; and (2) a second portion of said opening having approximately the same diameter as the diameter of said mask formed through the remainder of said dielectric layer from the bottom of said first portion to said first surface of said dielectric layer by anisotropically etching the remainder of the thickness of said dielectric layer using the same mask opening whereby said second portion of said opening will be of constant diameter due to the anisotropic nature of said second etch, and both of said openings will be concentric due to the use of a single mask to form both openings.

6. The improved integrated circuit structure of claim 5 wherein said dielectric layer has a thickness of from about 1 to about 2 microns.

7. An improved integrated circuit structure comprising two metal layers separated by a dielectric layer and electrically connected together by an improved via interconnect comprising an opening extending through said dielectric layer and filled with a conductive material for interconnecting said two metal layers separated by said dielectric layer, said opening further comprising an enlarged generally hemispherical shaped first portion etched into said dielectric layer from a first surface of said dielectric layer and a smaller diameter second portion having sidewalls approximately normal to said first surface and extending from said enlarged portion through the remainder of said dielectric layer to the opposite surface of said dielectric layer.

* * * * *